United States Patent [19]

Zhang et al.

[11] Patent Number: 5,481,121

[45] Date of Patent: Jan. 2, 1996

[54] SEMICONDUCTOR DEVICE HAVING IMPROVED CRYSTAL ORIENTATION

[75] Inventors: Hongyong Zhang; Toru Takayama; Yasuhiko Takemura, all of Kanagawa, Japan

[73] Assignee: Semiconductor Energy Laboratory Co., Ltd., Kanagawa, Japan

[21] Appl. No.: 248,682

[22] Filed: May 25, 1994

[30] Foreign Application Priority Data

May 26, 1993 [JP] Japan .................... 5-147004

[51] Int. Cl.⁶ .................... H01L 23/54; H01L 27/01; H01L 29/167
[52] U.S. Cl. .................... 257/64; 257/72; 257/75; 257/291; 257/607
[58] Field of Search .................... 257/59, 64, 65, 257/72, 75, 291, 607, 70

[56] References Cited

U.S. PATENT DOCUMENTS

| | | | |
|---|---|---|---|
| 3,505,572 | 4/1970 | Yamashita et al. | 257/614 |
| 4,406,709 | 9/1983 | Celler et al. | 257/64 |
| 4,466,179 | 8/1984 | Kasten | 257/64 |
| 4,682,206 | 7/1987 | Tsuya et al. | 257/64 |
| 4,992,846 | 2/1991 | Sakakibara et al. | 257/64 |
| 5,147,826 | 9/1992 | Liu et al. | 437/233 |
| 5,170,244 | 12/1992 | Dohjo et al. | 257/72 |
| 5,177,578 | 1/1993 | Kakinoki et al. | 257/64 |
| 5,266,816 | 11/1993 | Sato et al. | 257/65 |
| 5,275,851 | 1/1994 | Fonash et al. | 427/578 |
| 5,313,076 | 5/1994 | Yamazaki et al. | 257/66 |
| 5,318,919 | 6/1994 | Noguchi et al. | 437/41 |

FOREIGN PATENT DOCUMENTS

| | | | |
|---|---|---|---|
| 61-84074 | 4/1986 | Japan | 257/64 |
| 63-170971 | 7/1988 | Japan | 257/64 |

OTHER PUBLICATIONS

C. Hayzelden et al., "In Situ Transmission Electron Microscopy Studies of Silicide–Mediated Crystallization of Amorphous Silicon" (3 pages), Appl. Phys. Lett., vol. 60, No. 2, 13 Jan. 1992, pp. 225–227.

A. V. Dvurechenskii et al., "Transport Phenomena in Amorphous Silicon Doped by Ion Implantation of 3d Metals", pp. 635–640, Phys. Stat. Sol. (a), 95 635 (1986).

T. Hempel et al., "Needle–Like Crystallization of Ni Doped Amorphous Silicon Thin Films", *Solid State Communications*, vol. 85, No. 11, pp. 921–924, 1993.

Primary Examiner—Mahshid D. Saadat
Attorney, Agent, or Firm—Sixbey, Friedman, Leedom & Ferguson; Gerald J. Ferguson, Jr.; Eric J. Robinson

[57] ABSTRACT

Nickel is introduced to a peripheral circuit section and a picture element section on an amorphous silicon film to crystallize them. After forming gate electrodes and others, a source, drain and channel are formed by doping impurities, and laser is irradiated to improve the crystallization. After that, electrodes/wires are formed. Thereby an active matrix type liquid crystal display whose thin film transistors (TFT) in the peripheral circuit section are composed of the crystalline silicon film crystal-grown in the direction parallel to the flow of carriers and whose TFTs in the picture element section are composed of the crystalline silicon film crystal-grown in the direction vertical to the flow of carriers can be obtained.

7 Claims, 7 Drawing Sheets

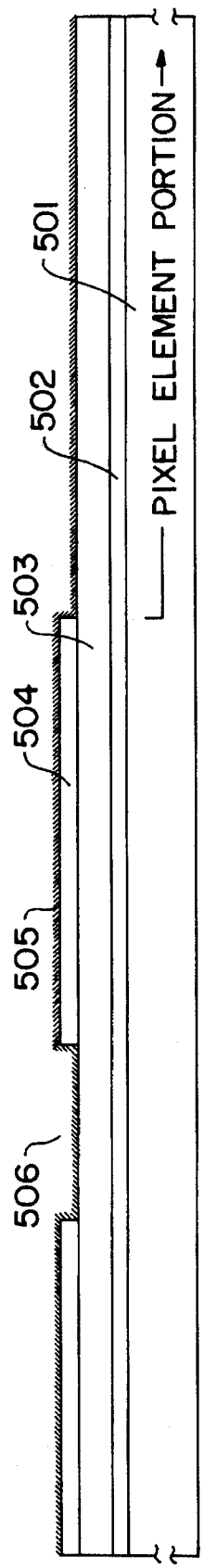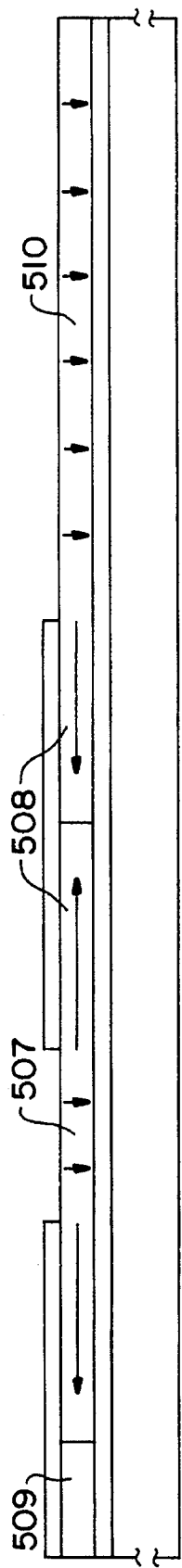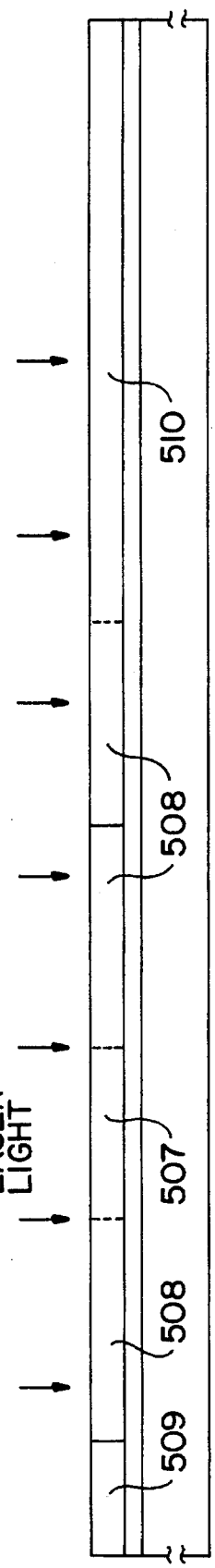

SEMICONDUCTOR DEVICE HAVING IMPROVED CRYSTAL ORIENTATION

BACKGROUND OF THE INVENTION

1. Field of the Invention

The present invention relates to a semiconductor device using TFTs (thin film transistor) mounted on an insulating substrate such as a glass and more particularly to a semiconductor device utilizable for an active matrix type liquid crystal display.

2. Description of the Related Art

A semiconductor device having TFTs on an insulating substrate such as a glass is known to be utilized in an active matrix type liquid crystal display, image sensor and the like using such TFTs for driving picture elements.

Generally a thin film silicon semiconductor is used for the TFT used in such devices. The thin film silicon semiconductor may be roughly classified into two semiconductors; those composed of amorphous silicon (a-Si) semiconductor and those composed of silicon semiconductor having a crystallinity. The amorphous silicon semiconductor is most generally used because its fabrication temperature is low, it can be fabricated relatively easily by a vapor phase method and it has a mass-producibility. However, because it is inferior as compare to the silicon semiconductor having a crystallinity in terms of physical properties such as an electrical conductivity, it has been strongly demanded to establish a method for fabricating a TFT composed of the silicon semiconductor having a crystallinity to obtain a faster characteristic. By the way, as the silicon semiconductor having a crystallinity, there are known to exist a polycrystal silicon, microcrystal silicon, amorphous silicon containing crystal components, semi-amorphous silicon having an intermediate state between crystallinity and amorphousness.

The following method is known to obtain those thin film silicon semiconductors having a crystallinity: (1) directly form a film having a crystallinity, (2) form an amorphous semiconductor film and crystallize it by energy of laser light, and (3) form an amorphous semiconductor film and crystallize it by applying thermal energy.

However, it is technically difficult to form a film having favorable physical properties of semiconductor on the whole surface of a substrate by the method of (1). Further, it has a problem in terms of cost that because its film forming temperature is so high as more than 600° C., a low cost glass substrate cannot be used. The method (2) has a problem that its throughput is low because an irradiation area is small when an eximer laser which is presently most generally used is used. Further, the laser is not stable enough to homogeneously treat the whole surface of a large area substrate. Accordingly, it is thought to be a next generation technology. Although the method (3) has a merit that it allows to accommodate with a large area as compare to the methods (1) and (2), it is also necessary to apply such a high temperature as more than 600° C. as the heating temperature. Accordingly, the heating temperature needs to be reduced in a case of using a low cost glass substrate. In particular, because the screen of present liquid crystal display is enlarged more and more, a large size glass substrate needs to be used accordingly. When such a large size glass substrate is used, its contraction and strain caused during the heating process indispensable in fabricating the semiconductor produce a large problem that they reduce an accuracy of mask positioning and the like. In particular, because the strain point of the 7059 glass which is presently most generally used is 593° C., it deforms largely by the conventional heating crystallization method. Further, beside the problems concerning to the temperature, it takes more than tens of hours as the heating time required for the crystallization in the conventional process, so that such time needs to be shortened.

SUMMARY OF THE INVENTION

Accordingly, it is an object of the present invention to solve the aforementioned problems by providing a process which realizes both the reduction of the temperature necessary for the crystallization and the shortening of the heating time in a method for fabricating a thin film composed of silicon semiconductor having a crystallinity using a method for crystallizing a thin film composed of amorphous silicon by heating. The silicon semiconductor having a crystallinity fabricated by using the process of the present invention has physical properties equal to or superior than those of the silicon semiconductor fabricated by the prior art and is usable for an active layer region of TFTs. By using this technique, TFTs having necessary characteristics can be formed selectively on a substrate.

The inventors of the present invention perform the following experiments and study concerning to the method of forming a silicon semiconductor film by a CVD method or sputtering method and crystallizing the film by heat.

When, after an amorphous silicon film is formed at first on a glass substrate, a mechanism of crystallizing the film by heating is studied through experiments, it is recognized that the crystal growth begins from the interface between the glass substrate and the amorphous silicon and it proceeds in a columnar shape in vertical to the surface of the substrate if the thickness of the film is more than a certain value.

The above phenomenon is considered to have been caused because crystal nuclei (seeds) which would become bases of crystal growth existed at the interface of the glass substrate and the amorphous silicon film and the crystals grow from the nuclei. Such crystal nuclei are considered to have been impurity metal elements and crystal components (crystal components of silicon oxide is considered to be existing on the surface of glass substrate as it is called as a crystallized glass) which are existed on the surface of the substrate in a very small amount.

Then the inventors consider that it is possible to lower the crystallization temperature by positively introducing the crystal nuclei. In order to confirm that effect, the inventors try experiments by forming a film of a very small amount of another metal on the glass substrate, forming a thin film composed of amorphous silicon thereon and then heating and crystallizing it. As a result, it is confirmed that the crystallization temperature reduces when several metals are formed on the substrate and therefore it is presumed that crystal grows centering on foreign materials as the crystal nuclei. Then the inventors study the mechanism in more detail on the plurality of impurity metals for reducing the temperature. The plurality of impurity elements are Ni, Fe, Co, Pd and Pt.

It can be considered that the crystallization has two stages; an initial stage of producing a nucleus and a stage of crystal growth from the nucleus. While the speed of the initial nucleus production stage may be observed by measuring a time until a spot microcrystal is produced in a fixed temperature, this time is shortened any time when an amorphous silicon thin film is formed using the impurity metals as the base and the effect of the introduction of the crystal nucleus on the lowering of the crystallization temperature is verified. Further, unexpectedly, it is observed that the speed of the crystal growth after the production of nucleus also remarkably increases in the crystallization of the amorphous silicon thin film formed on a certain metal when the growth of the crystal grain after the production of nucleus is studied by varying heating time. Although this mechanism is not clarified yet, it is presumed that some catalytic effect is acting.

In any case, it is found that when the thin film composed of amorphous silicon is formed on the film of a very small amount of a certain metal formed on the glass substrate and is then heated and crystallized, a sufficient crystallinity can be obtained due to the two effects described above at a temperature less than 580° C. and in about 4 hours which have been impossible in the past. Nickel has the most remarkable effects among impurity metals having such effects and is an element selected by the inventors.

How nickel is effective will now be exemplified. Although more than 10 hours of heating time is necessary in crystallizing a thin film composed of amorphous silicon formed by a plasma CVD method on a substrate (Corning 7059 glass), on which a thin film containing a very small amount of nickel is not formed, by heating in a nitrogen atmosphere at 600° C., the same crystallization state can be obtained by heating at 580° C. for about 4 hours when the thin film composed of amorphous silicon formed on the substrate on which the thin film containing a very small amount of nickel is formed is used. By the way, Raman spectroscopic spectrum is used in the judgment (determination) of the crystallization at this time. It can be seen that the effect of nickel is very great even only from this fact.

As it is apparent from the above explanation, it is possible to lower the crystallization temperature and to shorten the time required for the crystallization when the thin film composed of amorphous silicon is formed on the thin film of a very small amount of nickel. Now a more detailed explanation will be made assuming that this process is used in fabricating TFTs. By the way, the nickel thin film has the same effect even if it is formed on the amorphous silicon film, not only on the substrate (lower side of amorphous silicon film), and in the case of ion implantation or plasma treatment as described later in detail. Accordingly, such a series of process shall be called as "nickel micro-adding". Technically it is also possible to perform the nickel micro-adding during when the amorphous silicon film is formed.

At first, the method of nickel micro-adding will be explained. The method of forming the thin film of a small amount of nickel on the substrate and forming the film of amorphous silicon thereafter and the method of forming the film of amorphous silicon at first and forming the thin film of a small amount of nickel thereon have the same effect of lowering the temperature by adding a small amount of nickel. Further, it is clarified that any of the methods of sputtering method, vapor deposition method, spin coating method and a method using plasma may be used in forming the film. However, when the thin film containing a small amount of nickel is formed on the substrate, the effect is more remarkable when a thin film (base film) of silicon oxide is formed on the substrate and then the thin film of a small amount of nickel is formed on the base film rather than when the thin film of a small amount of nickel is formed directly on the 7059 glass substrate. It is important for the low temperature crystallization of the present invention that silicon and nickel directly contact and it is considered that components other than silicon may disturb the contact or reaction of the both in the case of the 7059 glass.

Further, as for the method of nickel micro-adding, it is confirmed that almost the same effect can be obtained by adding (introducing) nickel by ion implantation, other than the methods of forming the thin film contacting above or under the amorphous silicon. For nickel, it is confirmed that the temperature can be lowered when an amount of more than $1\times10^{15}$ atoms/cm$^3$ is added. However, because a shape of peak of Raman spectroscopic spectrum becomes apparently different from that of simple substance of silicon when the added amount is more than $5\times10^{19}$ atoms/cm$^3$, an actual usable range is considered to be from $1\times10^{15}$ atoms/cm$^3$ to $1\times10^{19}$ atoms/cm$^3$. When the nickel concentration is less than $1\times10^{15}$ atoms/cm$^3$, the action as a catalyst such as nickel for the crystallization decreases. Further, when the concentration is more than $5\times10^{19}$ atoms/cm$^3$, NiSi is locally produced, losing the characteristics of semiconductor. In the crystallized state, the lower the nickel concentration, the more favorably the semiconductor may be used.

Next, the configuration of the crystal when the nickel micro-adding is performed will be explained. It is known that when no nickel is added, nuclei are produced at random from the crystal nuclei at the interface of the substrate and the like, that the crystals grow at random from the nuclei until a certain thickness and that columnar crystals in which (110) direction is arranged in a direction vertical to the substrate generally grow in a thicker thin film as described above and an almost uniform crystal growth is observed across the whole thin film as a matter of course. Contrary to that, when a small amount of nickel is added, the crystal growth is different at a region into which the nickel is added and at the surrounding section. That is, it is clarified through pictures of a transmission electron beam microscope that in the region into which nickel is added, the added nickel or a compound of nickel and silicon become the crystal nucleus and columnar crystal grows almost vertical to the substrate similarly to one into which no nickel is added. It is also confirmed that the crystallization proceeds in a low temperature also in the surrounding region where no nickel is added. A peculiar crystal growth that the direction vertical to the substrate is arrayed in (111) in that portion and needle or columnar crystal grows in parallel to the substrate, is seen. It is observed that some large crystals among the crystals grown in the lateral direction parallel to the substrate grow as long as several hundreds micron from the region where a small amount of nickel is added and it is found that the growth increases in proportional to the increase of time and rise of temperature. For example, a growth of about 40 micron is observed in heating at 550° C. for 4 hours. Further, it is clarified that the large crystals in the lateral direction are all single-crystal like according to pictures taken by the transmission electron beam microscope. When the nickel concentration is examined at the portion where a small amount of nickel is added, at the nearby lateral growth portion and at the further distant amorphous portion (the low temperature crystallization does not occur at the considerably distant portion and the amorphous portion remains) by SIMS (secondary ion mass spectrometry), less amount of nickel by about 1 digit from the portion where a small amount of nickel is added is detected from an amount of the lateral growth portion and it is observed that it diffuses within the amorphous silicon. Further less amount of nickel by about 1 digit is observed in the amorphous portion. Although the relationship between this fact and the crystal configuration is not clear yet, it is possible to form a silicon thin film having a crystallinity of desired crystal configuration at a desired section by controlling a nickel adding amount and an adding position.

Next, electrical characteristics of the nickel micro-added portion where a small amount of nickel is added and the nearby lateral growth portion will be explained. Among the electrical characteristics of the nickel micro-added portion, an electrical conductivity is almost the same with the film into which no nickel is added, i.e. the film crystallizes at about 600° C. for tens of hours. When an activation energy is found from the temperature dependency of the electrical conductivity, no behavior considered to have been caused by the level of nickel is observed when the nickel added amount is $10^{17}$ atoms/cm$^3$ to $10^{18}$ atoms/cm$^3$. As far as this fact is concerned, it can be concluded that there is no problem in the operation of TFT if the nickel concentration within the film used in an active layer of TFT and others is less than around $10^{18}$ atoms/cm$^3$.

Contrary to that, the electrical conductivity of the lateral growth portion is higher than that of the nickel micro-added portion by more than 1 digit, which is considerably high for a silicon semiconductor having a crystallinity. This fact is considered to have been caused by that less or almost no crystal boundaries existed between electrodes where electrons (carriers) pass through because the current passing direction and the crystal lateral growth direction coincide; it coincides with the result of the pictures of the transmission electron beam microscope without contradiction. That is, it coincides with the observation fact that the needle or columnar crystals grow in the direction parallel to the substrate.

Here, based on the various characteristics described above, an applying method for a TFT will be explained. As an application field of the TFT, an active type liquid crystal display in which TFTs are used for driving picture elements will be assumed here.

While it is important to suppress a contraction of the glass substrate in the late large screen active type liquid crystal display as described above, the use of the nickel micro-adding process of the present invention allows to crystallize at a fully lower temperature as compare to the strain point of glass and is especially suitable. The present invention allows to replace a conventionally used amorphous silicon with silicon having a crystallinity by adding a small amount of nickel and by thermally annealing in about 450° to 550° C. for about 4 hours. Although it may be necessary to change design rules and others corresponding to that, it can be fully accommodated with the conventional equipments and process and its merit is considered to be great.

Furthermore, the present invention allows to form TFTs used for picture elements and those forming the drivers of the peripheral circuit separately utilizing the crystal configurations corresponding to each characteristic and hence is useful when it is applied especially for the active matrix type liquid crystal display. That is, the TFTs used for the picture element in the active matrix type liquid crystal display are not required to have so much mobility and rather than that, there is more merit for the off current to be smaller. Then in the present invention, by directly performing the nickel micro-adding to the region which is to become the TFTs used for the picture element, it is possible to reduce an off current by growing crystals in a direction vertical to a surface of the substrate and by forming a number of crystal boundaries in a channel direction (a direction when a source region and a drain region are connected each other by a line). On the other hand, considering to apply the liquid crystal display for a workstation for the future, a very high mobility is required for the TFTs structuring the peripheral circuit. Then it is effective to fabricate TFTs having a very high mobility by adding a small amount of nickel near the TFTs which form the drivers of the peripheral circuit to grow crystals in one direction (growth in lateral direction) from there and to cause the crystal growth direction to coincide with the current passing direction into which carriers move, that is, direction when a source region and a drain region are connected each other by a line).

That is, an object of the present invention is to provide a crystalline silicon semiconductor film constituting desired TFTs which a crystal growth direction is controlled, to selectively fabricate TFTs satisfying necessary characteristics on a substrate in a semiconductor device in which a large number of thin film transistors are formed on the substrate such as a glass substrate.

The feature of the present invention is, in an active matrix type liquid crystal display having a peripheral circuit portion and a pixel element portion, to provide TFTs having a crystalline silicon film crystal-grown in a direction vertical to a substrate in the pixel element portion and TFTs having a crystalline silicon film crystal-grown in a direction parallel to a substrate in the peripheral circuit portion. In the pixel element portion, by using a crystalline silicon film crystal-grown in a direction vertical to a substrate, a structure that carriers moving between a source and a drain cross crystal boundaries can be obtained so that the off current is low in TFTs. On the other hand, in the peripheral circuit portion, TFTs having a high mobility (that is, a large on current) can be obtained by forming the source and drain in parallel to the crystal growth direction. In operation of TFTs, since the carriers flow between the source and drain, possibility which the carriers cross the crystal boundaries becomes low by forming the source and drain in crystal growth direction, therefore, resistance to the carriers can be reduced.

As described above, the crystal growth direction may be freely selected in the direction either vertical to the substrate or parallel to the substrate by adding a small amount of nickel. Further, the relationship of the direction into which carriers flow during operation of the TFT and the crystal growth direction may be determined by selecting a direction (direction connecting a source and drain) and position of the TFT to be formed. The direction into which carriers flow described above is the direction connecting the source and drain when an insulated gate type field effect semiconductor device is used for example as the TFT.

The present invention may be used for an active matrix type liquid crystal display. Further, the TFT having a high mobility may be obtained by using the crystalline silicon film whose crystal has grown in the direction parallel to the surface of substrate.

Further, the present invention relates to a fabrication process for obtaining such TFTs as described above. The present invention utilizes a technology for selectively providing crystallized regions by adding a small amount nickel.

Although it is typically useful to use nickel as a small amount of metal element for promoting the crystallization, the similar effect can be obtained even by cobalt, iron and platinum in the present invention. Further, although a kind of substrate is not specifically limited, the usefulness of the present invention that the crystalline silicon film can be obtained in a low temperature less than 600° C. as compare to the conventional method become remarkable when it is used for a glass substrate and particularly for a large area glass substrate.

While the crystalline silicon film may be thus obtained by selectively crystallizing it in a direction vertical or parallel to a surface of a substrate, the characteristics of such crystalline silicon film may be improved further by irradiating laser or an equivalent strong light after the crystallization process. That is, insufficiently crystallized components left at the crystal boundaries and others may be crystallized due to that. By the way, it is necessary for the region in which the TFT using the amorphous silicon film is formed not to be irradiated by such strong light, because the amorphous silicon is crystallized by the irradiation of such strong light. In this process, characteristics of both silicon films crystal-grown in vertical or parallel to the surface of the substrate can be improved.

BRIEF DESCRIPTION OF THE DRAWINGS

FIGS. 5A through 5E are drawings showing a process for fabricating TFT circuits in the peripheral circuit section and picture element section in the liquid crystal display according to another embodiment of the present invention.

DETAILED DESCRIPTION OF PREFERRED EMBODIMENTS

Figure 1:
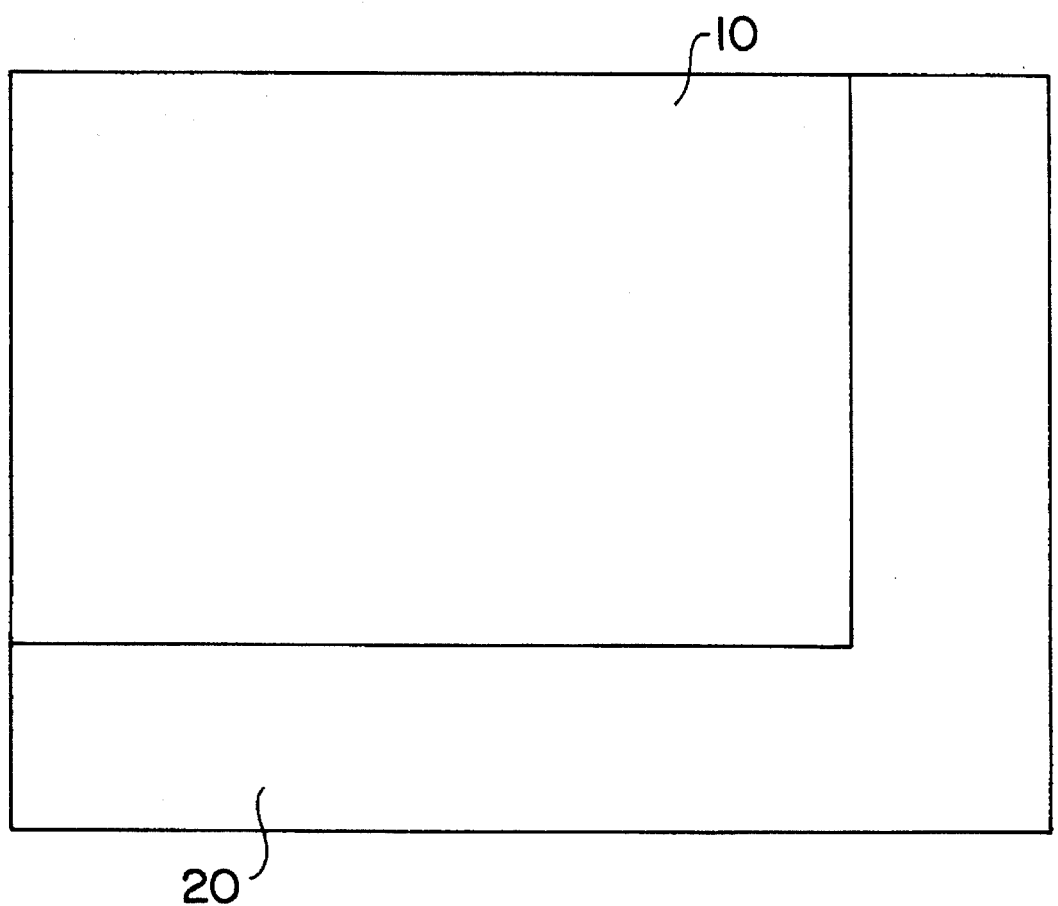
FIG. 1 is a drawing showing a schematic construction of a liquid crystal display according to an embodiment of the present invention.

Referring now to the drawings, preferred embodiments of the present invention will be explained.

[First Embodiment]

FIG. 1 is a top plan view showing a construction of a liquid crystal display of the embodiment of the present invention in outline, wherein a picture element section 10 having a plurality of picture element electrodes provided in matrix (not shown) and a peripheral circuit section 20 as a driving circuit for driving each of the picture element electrodes are shown. According to the present embodiment, thin film transistors (TFTs) for driving the picture elements and those composing the peripheral circuit are formed on an insulated substrate (e.g. a glass substrate). In concrete, the peripheral circuit section is a circuit structured as a CMOS in which P channel type TFT (PTFT) and N channel type TFT (NTFT) using silicon films having a crystallinity grown in the lateral direction (called as a crystalline silicon film) are provided complementarily and the picture element section is TFTs formed as NTFT using silicon films having a crystallinity grown in the longitudinal direction.

FIGS. 2A to 2D are drawings showing a process for fabricating the circuit in which the NTFT and PTFT structuring the peripheral circuit section 20 are formed complementarily. FIGS. 4A to 4D described later are drawings showing a process for fabricating the NTFT formed on the picture element section. Because the both fabricating processes are performed on the same substrate, common processes are executed simultaneously. That is, the processes shown in FIGS. 2A to 2D and those shown in FIGS. 4A to 4D correspond each other, so that they are carried out in the same time, respectively.

Figure 2A:
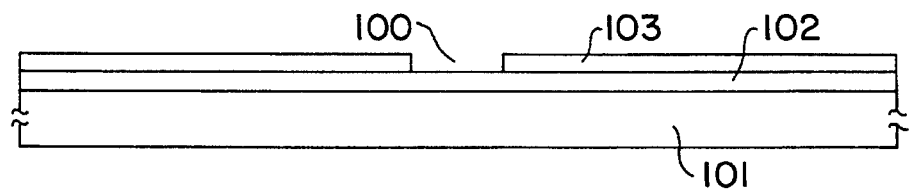
FIGS. 2A through 2D are drawings showing a process for fabricating a circuit in which NTFT and PTFT which compose a peripheral circuit section of the liquid crystal display are formed complementarily according to the embodiment of the present invention.
Figure 2B:
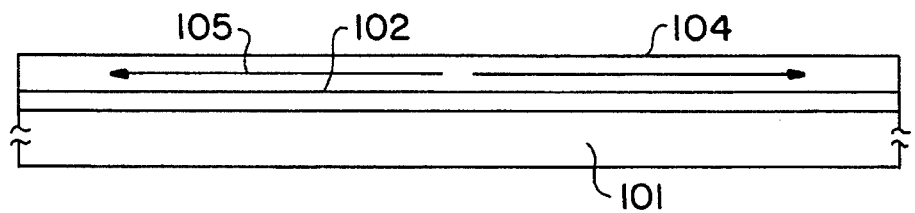

At first, a silicon oxide base film 102 having a thickness of 2000 angstrom is formed on a glass substrate (Corning 7059) 101 by a sputtering method. A mask 103 formed by a metal mask or silicon oxide film is provided only on the peripheral circuit section 20 as shown in FIG. 2A. By the way, because nickel introduced in a later process easily diffuses also within the silicon oxide film, a thickness of more than 1000 angstrom is necessary when the silicon oxide film is used as the mask 103. The base film 102 is exposed in a slit shape by the mask 103. That is, seeing the state of FIG. 2A from above, the base film 102 is exposed in the slit shape by a slit shape region 100 while the other region is masked. The mask 103 is covered on the whole surface of the picture element section 10 shown in FIG. 4A and the base film 102 is masked by the mask 103.

After providing the mask 103, a nickel silicide film (chemical formula: $NiSi_x$, $0.4 \leq x \leq 2.5$, $x=2.0$ for example) having a thickness of 5 to 200 angstrom, e.g. 20 angstrom, is formed by a sputtering method. As a result, the nickel silicide film is formed over the whole area of the peripheral circuit section 20 and the picture element section 10. After that, the mask 103 is removed to selectively form the nickel silicide film only on the region 100. That is, it means that the nickel micro-adding has been selectively made on the region 100.

Next, after removing the mask 103, an intrinsic (I type) amorphous silicon film 104 having a thickness of 500 to 1500 angstrom, e.g. 1000 angstrom, is deposited by a plasma CVD method. After that, it is crystallized by annealing for 4 hours at 550° C. under a hydrogen reducing atmosphere (preferably a partial pressure of hydrogen is 0.1 to 1 atmospheric pressure). Although the annealing temperature may be selected within a range of about 450° C. to 700° C., a preferably temperature range is 450° C. to 550° because it takes time for the annealing if the annealing temperature is low and the same result as that in the prior art is obtained about if the temperature is high. By the way, this annealing may be carried out in an inactive atmosphere (e.g. a nitrogen atmosphere) or air.

The silicon film 104 is crystallized in a direction vertical to the substrate 101 in the region 100 where the nickel silicide film has been selectively formed. On the other hand, crystal grows in a lateral direction (direction parallel to the substrate) from the region 100 as shown by arrow 105 in the peripheral region of the region 100. In the silicon film 104 in the picture element section 10 (see FIG. 4B) where nickel silicide film is formed, crystal grows in a direction vertical to the substrate 101. By the way, a distance of crystal growth in the direction shown by the arrow 105 which is parallel to the substrate 101 is about 40 micron in the above crystal growth.

Figure 4A:
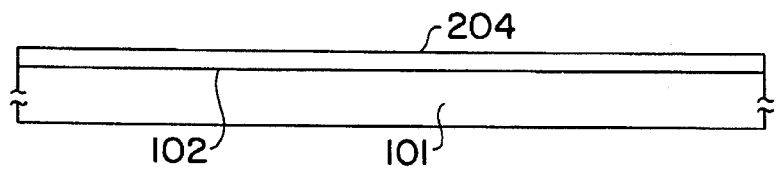
FIGS. 4A through 4D are drawings showing a process for fabricating a NTFT formed in a picture element section in the liquid crystal display according to the embodiment of the present invention.
Figure 4B:
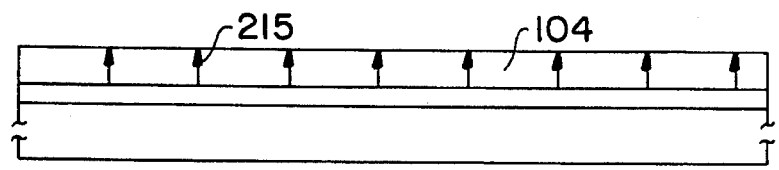

The amorphous silicon film at the peripheral circuit section 20 may be crystallized by the process described above. Here, the crystal grows in the lateral direction (direction parallel to the substrate 101) shown in FIG. 2B in the peripheral circuit section 20 and the crystal grows in a direction vertical to the substrate 101 in the picture element section 10, as shown in FIG. 4B.

After that, TFTs are separated between the elements, and the silicon film 104 at unnecessary part is removed to form an island-shape element regions. In this process, if a length of an active layer of the TFT (source/drain regions and channel forming region) is within 40 micron, the source/drain regions and channel forming region in the peripheral circuit portion may be structured by the crystalline silicon film grown in the direction parallel to the substrate 101. Further, if the channel forming region is structured by the crystalline silicon film, the length of the active layer may be prolonged further.

Then a silicon oxide film 106 having thickness of 1000 angstrom is formed as a gate insulating film by a sputtering method. Silicon oxide is used as a target in the sputtering. A temperature of the substrate during the sputtering is 200° to 400° C., e.g. 350° C. Oxygen and argon are used as an atmosphere of the sputtering and a ratio of the argon/oxygen=0 to 0.5, e.g. less than 0.1. Following to that, an aluminum film (containing silicon by 0.1 to 2%) having a thickness of 6000 to 8000 angstrom, e.g. 6000 angstrom, is formed by a sputtering method. By the way, it is desirable to consecutively carry out the processes for forming the silicon oxide film 106 and aluminum film.

Figure 4C:
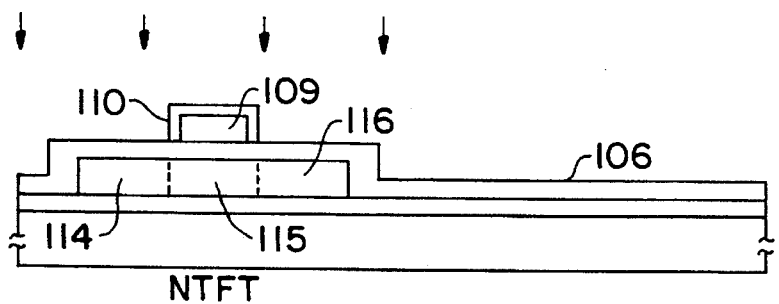

Gate electrodes 107 and 109 are formed by patterning the formed aluminum film. As mentioned above, the process shown in FIG. 2C and that shown in FIG. 4C are carried out simultaneously.

The surface of the gate electrodes 107 and 109 is anodized to form oxide layers 108 and 110 on the surface thereof. This anodization is carried out in an ethylene glycol solution containing tartaric acid by 1 to 5%. A thickness of the oxide layers 108 and 110 is 2000 angstrom.

Because the thickness of the oxide layers 108 and 110 is a thickness of an offset gate region formed in an ion doping process (a process for ion implanting a doping material) in the later process, a length of the offset gate region may be determined in the anodizing process.

Next, impurities (phosphorus and boron) are implanted to the silicon regions as regions of elements using the gate electrode 107 and surrounding oxide layer 108 and the gate electrode 109 and the surrounding oxide layer 110 respectively as masks. Phosphine ($PH_3$) and diborane ($B_2H_6$) are used as doping gas. An acceleration voltage is 60 to 90 kV, e.g. 80 kV, in the case of phosphine and 40 to 80 kV, e.g. 65 kV, in the case of diborane. Dosage is $1\times10^{15}$ to $8\times10^{15}$ $cm^{-2}$, e.g. $2\times10^{15}$ $cm^{-2}$ of phosphorus and $5\times10^{15}$ $cm^{-2}$ of boron. In the doping, each element are selectively doped by covering regions which are not necessary to be doped by photoresist. As a result, N type impurity regions 114 and 116 and P type impurity regions 111 and 113 are formed and hence, a P channel type TFT (PTFT) region and N channel type TFT (NTFT) region may be formed. Further, a N channel type TFT may be formed in the same time as shown in FIG. 4C.

After that, annealing is carried out by irradiating laser light to activate the ion implanted impurities. Although KrF eximer laser (wavelength: 248 nm, pulse width: 20 nsec) is used for the laser light, another laser may be used. As laser light irradiating conditions, 2 to 10 shots, e.g. 2 shots, of laser light having an energy density of 200 to 400 mJ/$cm^2$, e.g. 250 mJ/$cm^2$, are irradiated per one spot. It is useful to heat up the substrate to around 200° to 450° C. during the irradiation of laser light. Because nickel has diffused in the region previously crystallized, the recrystallization readily advances by irradiating the laser light in the laser annealing process. Accordingly, the impurity regions 111 and 113 into which the impurity giving P type has been doped and the impurity regions 114 and 116 into which the impurity giving N type has been doped may be readily activated.

Figure 2C:
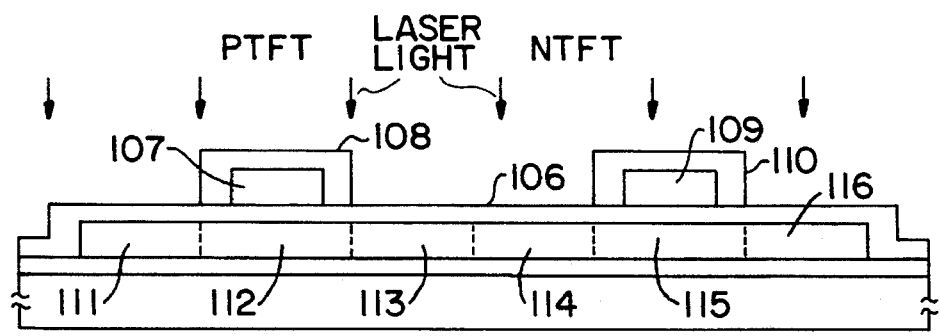
Figure 2D:
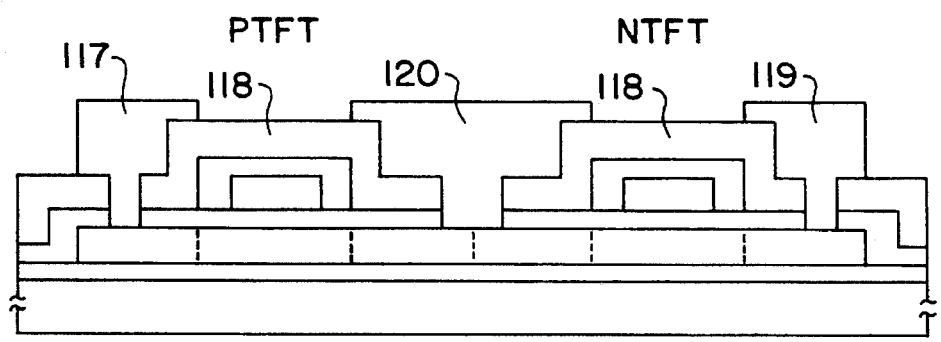
Figure 4D:
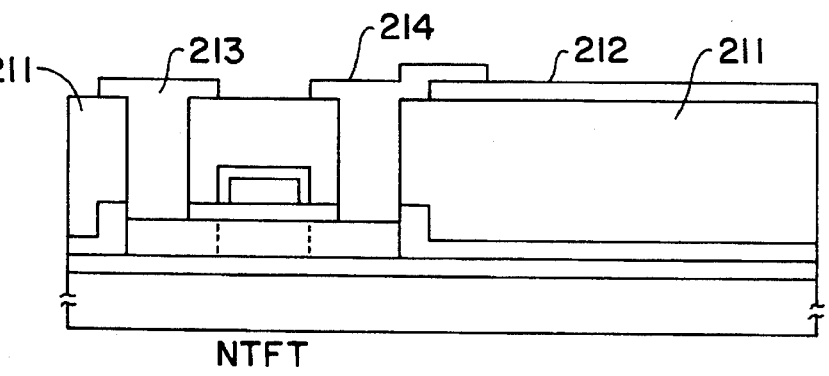

Following to that, a silicon oxide film 118 having a thickness of 6000 angstrom is formed as an interlayer insulator at the peripheral circuit section 20 as shown in FIG. 2D by a plasma CVD method. After forming contact holes on the interlayer insulator, electrode and wires 117, 119 and 120 of the TFTs are formed by a multi-layered film of titanium nitride and aluminum. At the picture element section 10, an interlayer insulator 211 is formed by silicon oxide and after forming contact holes, metal wires 213, 214 and ITO electrode 212 which are used as a picture element electrode are formed as shown in FIG. 4D. Finally, an annealing is carried out for 30 minutes at 350° C. in a hydrogen atmosphere of one atmospheric pressure to complete the TFT circuit or TFTs.

The circuit fabricated as described above has a CMOS structure in which the PTFT and NTFT are provided complementarily. However, it is also possible to fabricate two independent TFTs simultaneously in the process described above by cutting into two TFTs after fabricating them simultaneously.

Figure 3:
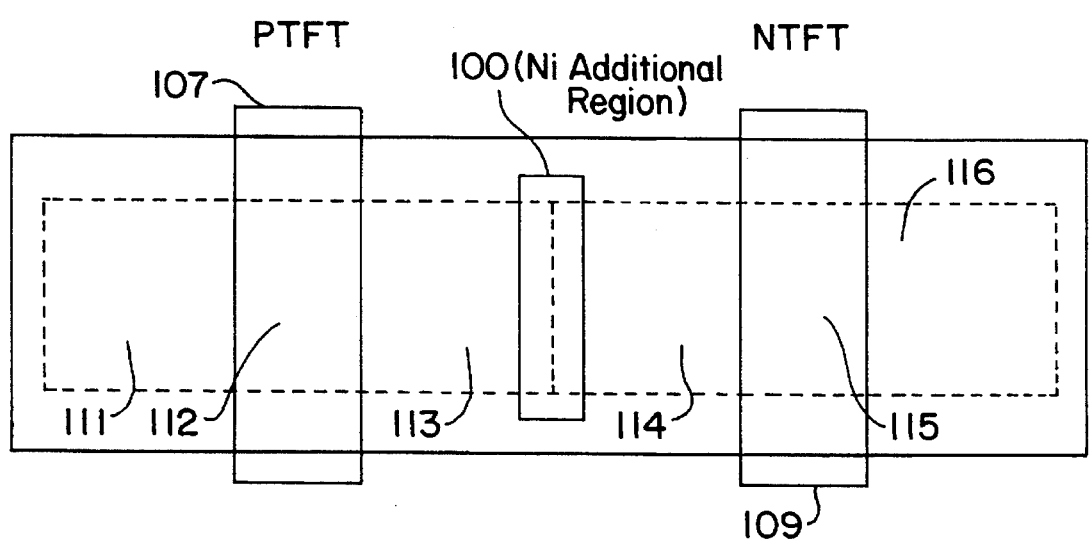
FIG. 3 is a drawing showing the configuration shown in FIG. 2D seen from the above.

Here, in order to show a positional relationship between the region into which nickel has been selectively introduced and the TFTs, a view of FIG. 2D seen from above is shown in FIG. 3. In FIG. 3, the nickel micro-adding is selectively performed to the region 100 and crystal grows in a lateral direction from the location into which nickel has been added by the thermal annealing. The source/drain regions 111 and 113 and the channel forming region 112 are formed as the PTFT in the lateral direction to which the crystal grows. Similarly, the source/drain regions 114 and 116 and the channel forming region 115 are formed as the NTFT.

Because a direction into which carriers flow and the direction of crystal growth coincide in the structure described above, the carriers do not cross the crystal boundary when moving, hence allowing to improve the operation of the TFTs. For example, a mobility of the PTFT fabricated by the process shown in FIGS. 2A to 2D is 120 to 150 $cm^2$/Vs and it is confirmed that the mobility is improved in comparison with a mobility of the prior art PTFT of 50 to 60 $cm^2$/Vs. Further, a mobility of 150 to 180 $cm^2$/Vs is obtained in the NTFT, which is higher in comparison with a mobility of the prior art NTFT of 80 to 100 $cm^2$/Vs.

Further, a gate insulating film and channel forming region are provided under the gate electrodes 107 and 109 in FIGS. 2C and 2D. As seen from FIG. 3, a plurality of TFTs may be simultaneously formed by further prolonging (by vertically extending in FIG. 3) the nickel micro-adding region.

On the other hand, in NTFT formed in the pixel element portion as shown in FIG.4, since a carrier moving (flowing) direction between the source 114 and drain 116 is in vertical to a crystal growth direction as shown in 215, carriers cross crystal boundaries when the carriers move. Therefore, the mobility is 30 to 80 $cm^2$/Vs and is characteristic no more than that of a conventional NTFT. However, when the characteristic of NTFT is examined, it is confirmed that off current is low in comparison with NTFT as shown in FIG. 2. This is an important characteristic when TFT is used as a driver of a pixel element electrode. Note that the conventional TFT is a TFT using a crystalline silicon film crystallized by thermal annealing (600° C. for 24 hours) an amorphous silicon film formed on a glass substrate.

Although the method of selectively forming nickel asthin film (because it is extremely thin, it is difficult to observe as a film) on the surface of the base film 102 under the amorphous silicon film 104 and growing the crystal from that portion has been adopted as the method for introducing nickel, it is also possible to selectively perform the nickel micro-adding after forming the amorphous silicon film 104. That is, it is possible to grow the crystal from the top or bottom side of the amorphous silicon film. Further, it is also possible to adopt a method of forming the amorphous silicon film previously and selectively implanting nickel ions into the amorphous silicon film 104 using the ion doping method. This method has a merit that a concentration of the nickel element may be controlled. Nickel micro-adding can be performed by plasma treatment instead of formation of a nickel thin film. Further, it is not always necessary to parallel (or vertically set) the crystal growth direction with the direction of the flow of carriers. Characteristics of the TFTs may be controlled by arbitrarily setting an angle between the direction into which carriers flow and the crystal growth direction.

[Second Embodiment]

A second embodiment is shown in FIGS. 5A to 5E and FIGS. 6A and 6B. After forming a silicon oxide film 502 having a thickness of 1000 to 5000 angstrom, e.g. 2000 angstrom, on a glass substrate 501, an amorphous silicon film having a thickness of 300 to 1500 angstrom, e.g. 500 angstrom, is formed by a plasma CVD method. Further, upon that, a silicon oxide film 504 having a thickness of 500 to 1500 angstrom, e.g. 500 angstrom, is formed. It is desirable to form those films consecutively. After that, the silicon oxide film 504 is selectively etched to form a window region 506 for introducing nickel. The window region 506 is formed in a region for fabricating TFTs for a peripheral driving circuit and the silicon oxide film 504 is removed in the picture element section.

Next, a nickel salt film 505 is formed by a spin coating method. Here the spin coating method will be explained. At first, for the film 505, nickel acetate or nickel nitrate is diluted by water or ethanol. Its concentration is 25 to 200 ppm, e.g. 100 ppm.

On the other hand, the substrate is dipped or immersed into a hydrogen peroxide solution or a mixed solution of hydrogen peroxide and ammonia to form a very thin silicon oxide film at the window region 506 and the pixel element section which are a section where the amorphous silicon film is exposed to improve the interface affinity of the nickel solution prepared as described above and the amorphous silicon film.

The substrate treated as such is placed in a spinner and is slowly rotated. Then 1 to 10 ml, e.g. 2 ml, of nickel solution is dropped on the substrate to expand the solution over the whole surface of the substrate. This state is maintained for 1 to 10 minutes, e.g. 5 minutes. After that, the speed of rotation is increased to carry out spin drying. This operation may be repeated for a plurality of times. Thereby the thin nickel salt film 505 is formed (FIG. 5A).

Here a heat treatment is carried out in a heating furnace within a range of 520° to 580° C. and 4 to 12 hours, e.g. at 550° C. for 8 hours. The atmosphere is nitrogen. As a result, nickel diffuses into the region right under the window region 506 and the pixel element section and crystallization starts from this region. A direction of crystallization is in vertical to the substrate. After that, the crystallized region expands into the surrounding area. An expansion direction of crystallization is in parallel to the substrate. As a result, three regions each having different characteristic are formed. A first region is a region 507 or the pixel element region 510 right under the window region 506 and is a region which crystallization proceeds in vertical to the substrate. A second region is a region 508 which is around the regions 507 and 510 and is a region which crystallization proceeds in parallel to the substrate. On the other hand, the region distant from the window region 506 as a third region is not crystallized and remains as amorphous silicon 509 (FIG. 5B).

After that, the crystallinity is improved further by irradiating KrF eximer laser light (wavelength: 248 nm) or XeCl eximer laser light (wavelength: 308 nm) by 1 to 20 shots, e.g. 5 shots, in air or oxygen atmosphere. The energy density of the laser light is 200 to 350 mJ/cm$^2$ and the temperature of the substrate is 200° to 400° C. (FIG. 5C).

After irradiating the laser, the silicon film 503 is etched to form a TFT region of the peripheral circuit and that of the picture element section. The region 508 corresponds to the channel forming region of TFT for the peripheral circuit. Then a silicon oxide film 511 having a thickness of 1000 to 1500 angstrom, e.g. 1200 angstrom, is formed and gate electrodes 512, 513 and 514 are formed by aluminum and anodized film thereof similarly to the case of the first embodiment. The gate electrode 512 is used for a PTFT in the peripheral circuit, gate electrode 513 is used for an NTFT in the peripheral circuit and gate electrode 514 is used for a TFT in the picture element section.

Figure 5D:
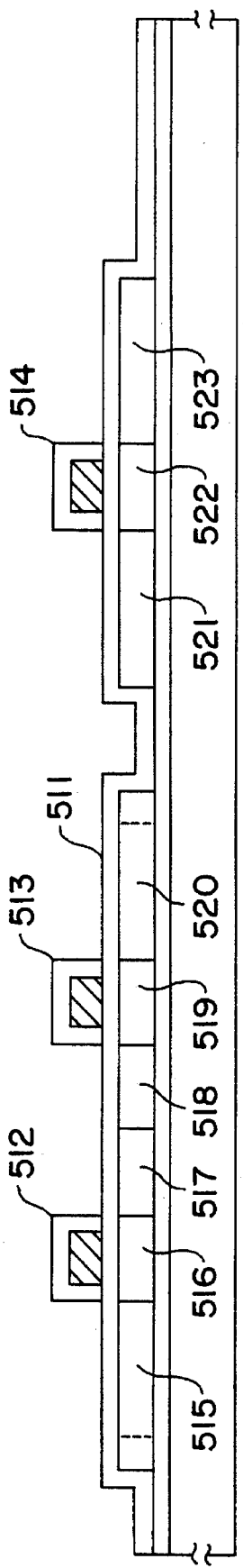

Using those gate electrodes as masks, N type and P type impurities are implanted to the silicon film by an ion doping method similarly to the first embodiment. As a result, a source 515, channel 516 and drain 517 of the PTFT in the peripheral circuit, a source 520, channel 519 and drain 518 of the NTFT in the peripheral circuit, a source 521, channel 522 and drain 523 of the NTFT in the picture element section are formed. After that, the laser is irradiated on the whole surface to activate the doped impurities similarly to the first embodiment (FIG. 5D).

Figure 5E:
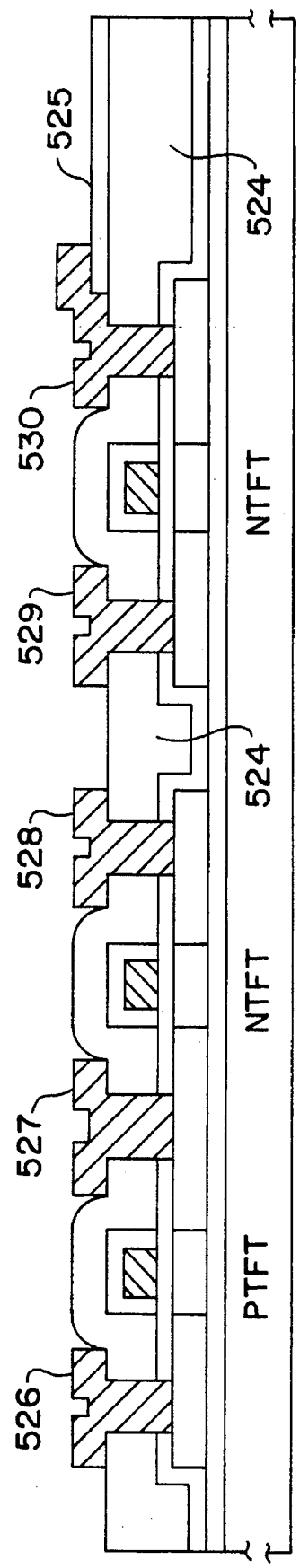

A silicon oxide film 524 having a thickness of 3000 to 8000 angstrom, e.g. 5000 angstrom, is formed as an interlayer insulator. Further, an ITO film having a thickness of 500 to 1000 angstrom, e.g. 800 angstrom, is formed by a sputtering method and it is pattern-etched to form a picture element electrode 525. Contact holes are formed at the source/drain of the TFTs, a two layered film of titanium nitrate (thickness: 1000 angstrom) and aluminum (thickness: 5000 angstrom) is deposited and it is pattern-etched to form electrodes and wires 526 through 530. Thus the peripheral circuit can be formed by crystalline silicon and the picture element section can be formed by amorphous silicon (FIG. 5E).

According to the present embodiment, laser is irradiated as shown in FIG. 5C to crystallize amorphous components left within the silicon crystals grown in a needle shape. Further, the needle crystal is crystallized so that it becomes fat centering on the needle crystal as the nucleus. It results in expanding a region where current flows and allows for larger drain current to flow.

The silicon film thus crystallized is thinned and then is observed by a transmission type electron microscope (TEM). FIG. 6A is a picture around the distal end of crystallized region of the silicon film crystallized by the growth in the lateral direction and the needle crystal can be observed. As seen from FIG. 6A, many non-crystallized amorphous regions exist among the crystals.

Figure 6B:
FIGS. 6A and 6B are SEM pictures around the distal end of crystallized region of a silicon film crystallized by a growth in a lateral direction in the fabricated TFT.
Figure 6A:
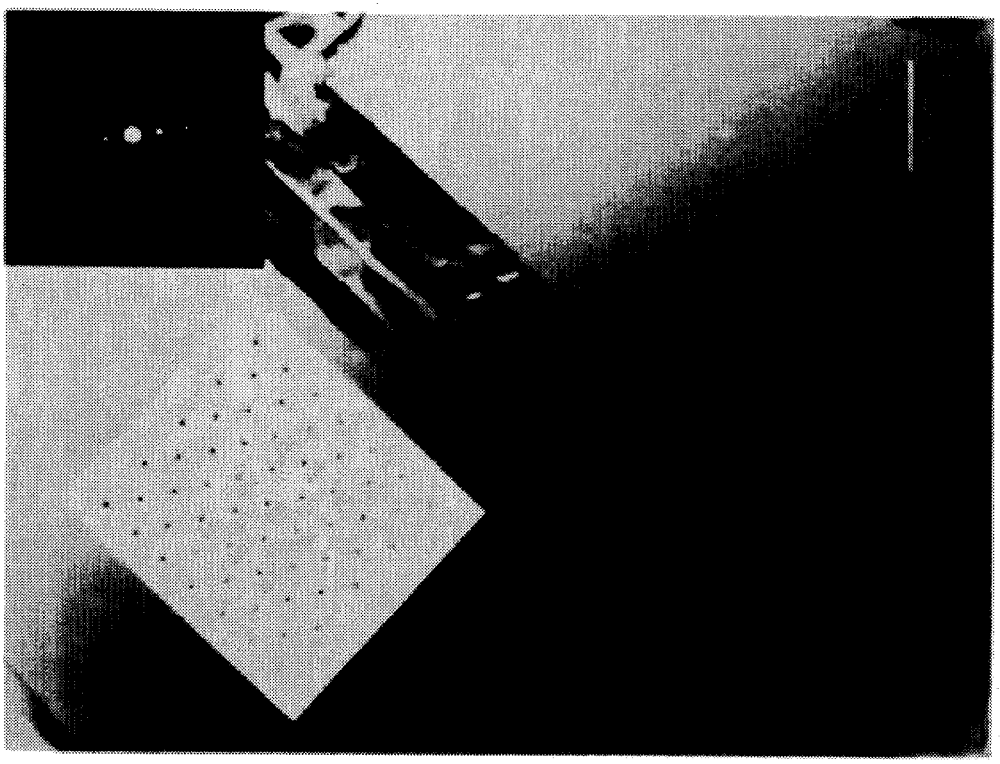

When it is irradiated by the laser under the condition of the present embodiment, a picture as shown in FIG. 6B is obtained. Although the amorphous regions which have occupied the most of the area in FIG. 6A are crystallized by this process, an electrical characteristic is not so good because the crystallized regions are produced at random. Noticed is the state of crystal in the region which is considered to have been amorphous among the needle crystals observed around the middle. A fat crystal region is formed in this region in a manner growing from the needle crystal (FIG. 6B).

While the pictures in FIGS. 6A and 6B represent the distal end region of the crystal where relatively more amorphous regions exist are observed to readily understand the state of the crystal growth, it is the same also around the nuclei of the crystal and middle of the crystal growth. Thus the amorphous portion can be reduced, the needle crystal can be fattened and the characteristics of the TFT can be improved further by irradiating laser.

As described above, the TFTs in the peripheral circuit section are composed of the crystalline silicon film whose crystal is grown in the direction parallel to the flow of carriers and the TFT in the picture element section is composed of the crystalline silicon film whose crystal is grown in the direction vertical to the flow of carriers in the active matrix type liquid crystal display. Thereby a high speed operation can be executed in the peripheral circuit section and switching elements whose off current value is small which are required to hold electric charge may be provided in the picture element section.

What is claimed is:

1. A semiconductor device, comprising:

a substrate; and a plurality of thin film transistors formed on the substrate, wherein a part of the plurality of thin film transistors has a crystalline silicon film having a crystal growth direction approximately parallel to a surface of the substrate and the other part of the plurality of thin film transistors has a crystalline silicon film having a crystal growth direction approximately vertical to the surface of the substrate.

2. A semiconductor device, comprising:

a substrate; and a plurality of thin film transistors formed on the substrate, wherein a part of the plurality of thin film transistors is provided as a peripheral circuit section of an active matrix type liquid crystal display and the other part of the plurality of thin film transistors is provided as a picture element section of the active matrix type liquid crystal display, and the thin film transistors provided as the peripheral circuit section have a crystalline silicon film having a crystal growth direction in a direction parallel to a surface of the substrate and the thin film transistors provided as the picture element section have a crystalline silicon film having a crystal growth direction in a direction vertical to the surface of the substrate.

3. An active matrix type liquid crystal display, comprising:

a picture element section having a plurality of picture element electrodes; and driving circuit means for driving each of the picture element electrodes, wherein the picture element section and the driving circuit means are composed of thin film transistors each having a substrate, and the thin film transistors composing the picture element section have a crystalline silicon film having a crystal growth direction approximately vertical to the surface of the substrate and the thin film transistors composing the driving circuit means have a crystalline silicon film having a crystal growth direction approximately parallel to the surface of the substrate.

4. A semiconductor device comprising:

a substrate; and a crystalline silicon film which is formed on the substrate and has a first region having a crystal growth direction approximately parallel to the substrate and a second region having a crystal growth direction approximately normal to the substrate.

5. An active matrix type liquid crystal display comprising:

a substrate;

a plurality of picture element electrodes each having a crystalline silicon region having a crystal growth direction approximately vertical to the substrate; and a plurality of driving circuit means for driving the picture element electrodes, the plurality of driving circuit means each having a crystalline silicon region having a crystal growth direction approximately parallel to the substrate, wherein the picture element electrodes and the driving circuit means are formed on the substrate.

6. A semiconductor device comprising:

a substrate;

at least one first thin film transistor which is formed on the substrate and has a first crystalline silicon region having a crystal growth direction approximately normal to the substrate; and at least one second thin film transistor which is formed on the substrate and has a second crystalline silicon region having a crystal growth direction approximately parallel to the substrate.

7. A semiconductor device comprising:

a plurality of thin film transistors each having a crystalline silicon region at least one first thin film transistor being formed to differ a crystal growth direction of the crystalline silicon region from a carrier moving direction of the first thin film transistor and at least one second thin film transistor being formed to approximately coincide a crystal growth direction of the crystalline silicon region with a carrier moving direction of the second thin film transistor.

* * * * *